US008344889B2

(12) United States Patent
Sands et al.

(10) Patent No.: US 8,344,889 B2
(45) **Date of Patent: *Jan. 1, 2013**

(54) SIDE LOADED SHORTED PATCH RFID TAG

(75) Inventors: Daniel L. Sands, Warsaw, IN (US); Clyde W. Sprowl, Huntington, IN (US); Michael D. Westrick, Huntertown, IN (US)

(73) Assignee: Solstice Medical, LLC, Fort Wayne, IN (US)

( * ) Notice: Subject to any disclaimer, the term of this patent is extended or adjusted under 35 U.S.C. 154(b) by 1056 days.

This patent is subject to a terminal disclaimer.

(21) Appl. No.: 12/331,696

(22) Filed: Dec. 10, 2008

(65) Prior Publication Data

US 2009/0153304 A1 Jun. 18, 2009

Related U.S. Application Data

(60) Provisional application No. 61/014,198, filed on Dec. 17, 2007.

(51) Int. Cl.

| | |
|---|---|
| ***G08B 13/14*** | (2006.01) |
| ***H04Q 5/22*** | (2006.01) |
| ***H01L 35/00*** | (2006.01) |
| ***H01Q 1/36*** | (2006.01) |
| ***H01Q 3/44*** | (2006.01) |
| ***H01Q 1/52*** | (2006.01) |
| ***H01Q 1/24*** | (2006.01) |
| ***G06K 7/08*** | (2006.01) |

(52) U.S. Cl. ................. 340/572.7; 340/572.1; 340/10.1; 343/700 R; 343/841; 343/702; 235/451

(58) Field of Classification Search ........................ None
See application file for complete search history.

(56) References Cited

U.S. PATENT DOCUMENTS

| | | | | |
|---|---|---|---|---|
| 4,672,384 | A * | 6/1987 | Roy et al. | 343/725 |
| 6,867,746 | B2 * | 3/2005 | Mendolia et al. | 343/841 |
| 7,057,564 | B2 | 6/2006 | Tsai et al. | |
| 7,095,372 | B2 | 8/2006 | Castany et al. | |
| 7,142,822 | B2 * | 11/2006 | Tanaka et al. | 455/74 |
| 7,916,033 | B2 * | 3/2011 | Westrick | 340/572.7 |
| 2006/0255946 | A1 * | 11/2006 | Khatri | 340/572.7 |
| 2007/0095913 | A1 | 5/2007 | Takahashi et al. | |
| 2008/0030422 | A1 * | 2/2008 | Gevargiz et al. | 343/860 |

OTHER PUBLICATIONS

Preliminary Report for PCT/US2008/086504 received from International Bureau dated Jul. 1, 2010.

* cited by examiner

*Primary Examiner* — Daniel Wu
*Assistant Examiner* — Emily C Terrell
(74) *Attorney, Agent, or Firm* — Taylor IP, P.C.

(57) ABSTRACT

An RFID tag includes a circuit board assembly having a substrate comprised of a material with a high dielectric constant of greater than approximately 4 and having a first side and a second side. A patch antenna is mounted to the first side of the substrate. A metallic ground plane is mounted to the second side of the substrate, and an RFID circuit is at the second side of the substrate. A shorting wall includes a plurality of through holes extending through the substrate and interconnecting the antenna with the ground plane. The plurality of through holes are generally linearly arranged relative to each other along an edge of the ground plane. An electrically conductive via extends through the substrate and interconnects the antenna with the RFID circuit. The via is at a distance from the shorting wall whereby an impedance of the RFID circuit approximately matches an impedance of the antenna. A backplane is coupled with the ground plane, on a side of the ground plane opposite the substrate.

17 Claims, 7 Drawing Sheets

SIDE LOADED SHORTED PATCH RFID TAG

CROSS REFERENCE TO RELATED APPLICATIONS

This is a non-provisional application based upon U.S. provisional patent application Ser. No. 61/014,198, entitled "SIDE LOADED SHORTED-PATCH RFID TAG", filed Dec. 17, 2007.

BACKGROUND OF THE INVENTION

1. Field of the Invention

The present invention relates to RFID tags, and, more particularly, to RFID tags used for identification, inventory and tracking applications.

2. Description of the Related Art

Radio frequency identification (RFID) tags are well known throughout industry, and are being increasingly utilized for supply chain management, inventory management, and logistic control. These tags can be written to and read from a handheld transceiver or fixed portal. Small glass encapsulated low frequency tags are currently being utilized on surgical tools, storage cases and implantable devices (see, e.g., FIG. 1). These small "capsules" contain their own "onboard" antenna, which suffer extreme radio frequency degradation and detuning due to interference created by the proximity of the metals utilized in surgical tools, storage cases and implantable devices. As a result of this proximity, virtual contact (actual physical contact or very short distances) must be maintained between the reader antenna and the RFID tag. This "virtual" contact requirement makes communication with a surgically implanted device, impossible, and reliable communication with a storage case or set of surgical tools impractical.

SUMMARY OF THE INVENTION

The invention in one form is directed to an RFID tag, including a circuit board assembly having a substrate comprised of a material with a high dielectric constant of greater than approximately 4 and having a first side and a second side. A patch antenna is mounted to the first side of the substrate. A metallic ground plane is mounted to the second side of the substrate, and an RFID circuit is at the second side of the substrate. A shorting wall includes a plurality of through holes extending through the substrate and interconnecting the antenna with the ground plane. The plurality of through holes are generally linearly arranged relative to each other along an edge of the ground plane. An electrically conductive via extends through the substrate and interconnects the antenna with the RFID circuit. The via is at a distance from the shorting wall whereby an impedance of the RFID circuit approximately matches an impedance of the antenna. A backplane is coupled with the ground plane, on a side of the ground plane opposite the substrate.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
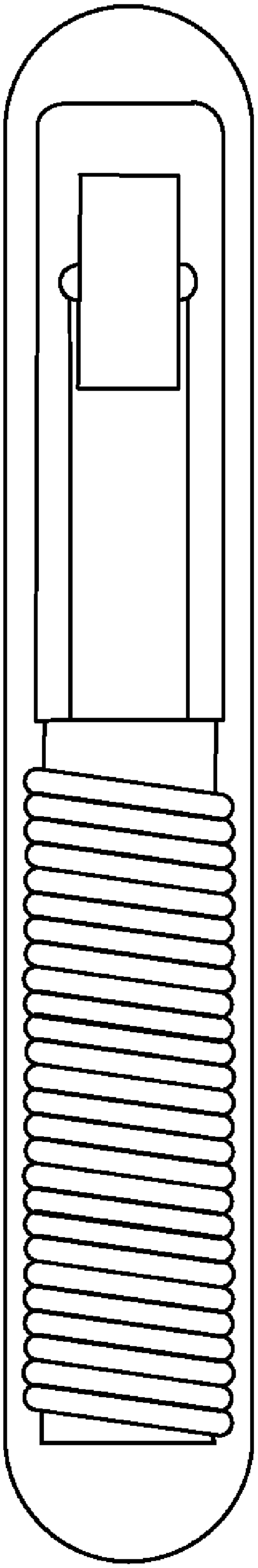
FIG. 1 PRIOR ART
FIG. 1 is an illustration of one embodiment of an existing RFID tag (capsule)
Figure 2A:
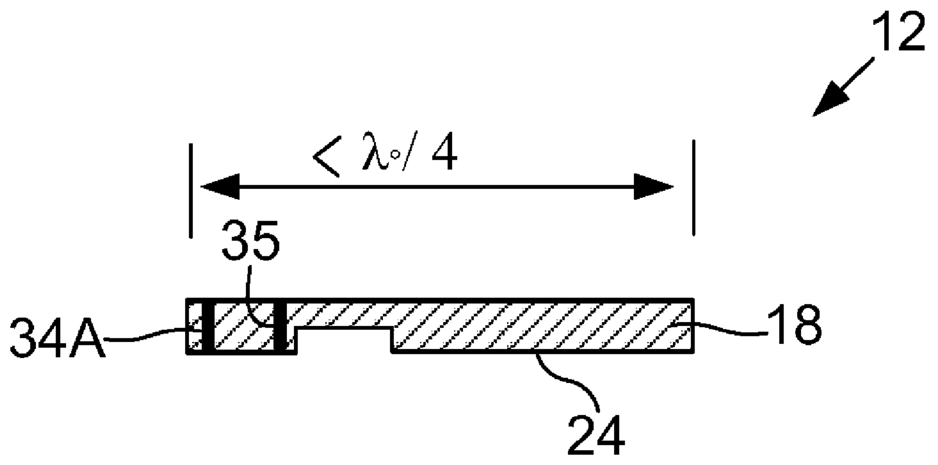
FIGS. 2A and 2B illustrate an embodiment of a sub ¼ wave side loaded shorted-patch antenna used in an embodiment of the RFID tag of the present invention.
Figure 2B:
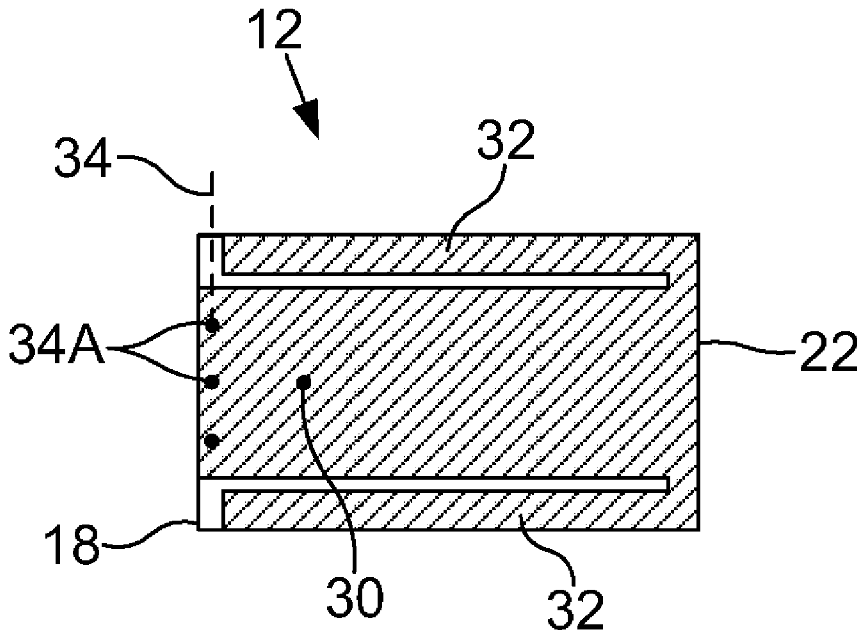
Figure 3A:
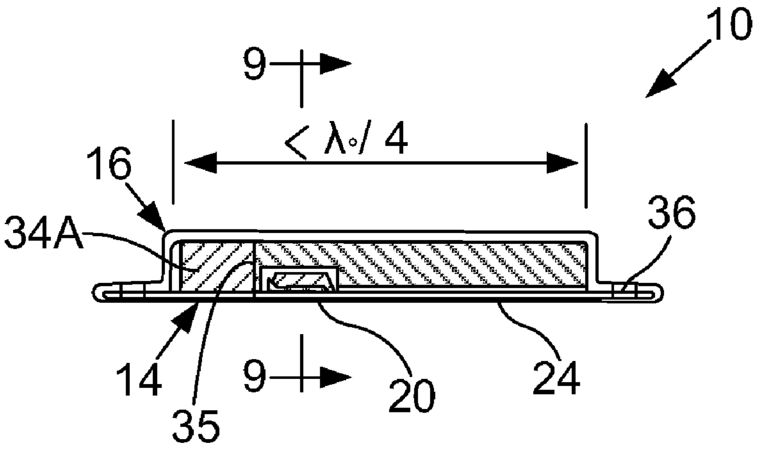
FIGS. 3A and 3B illustrate one embodiment of an RFID tag incorporating the antenna shown in FIG. 2.
Figure 3B:
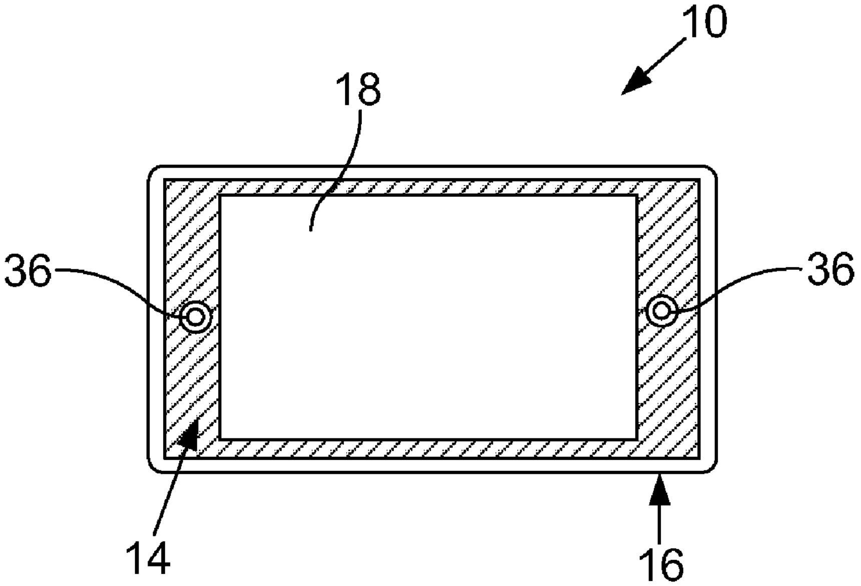
Figure 4:
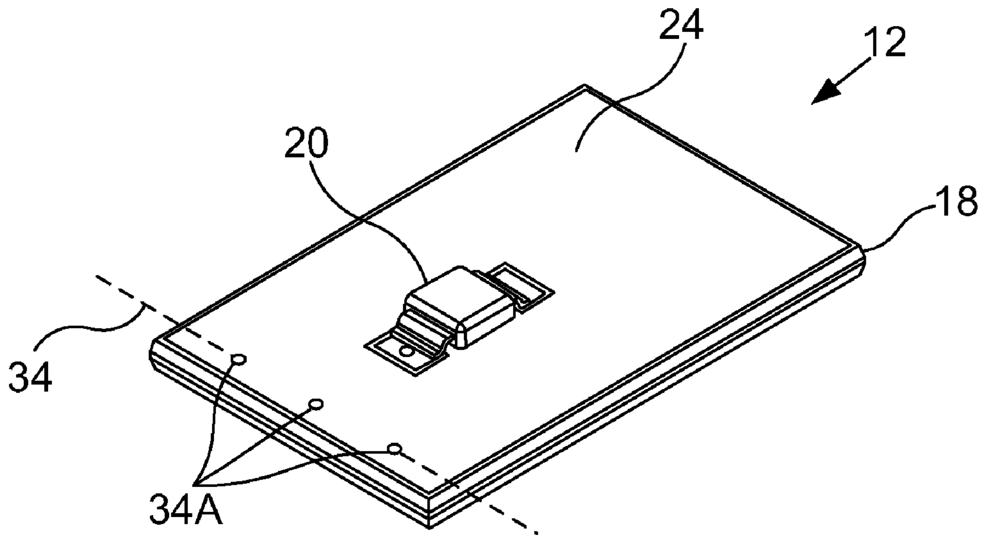
FIG. 4 is a perspective view of the circuit board assembly in FIGS. 2 and 3.
Figure 5:
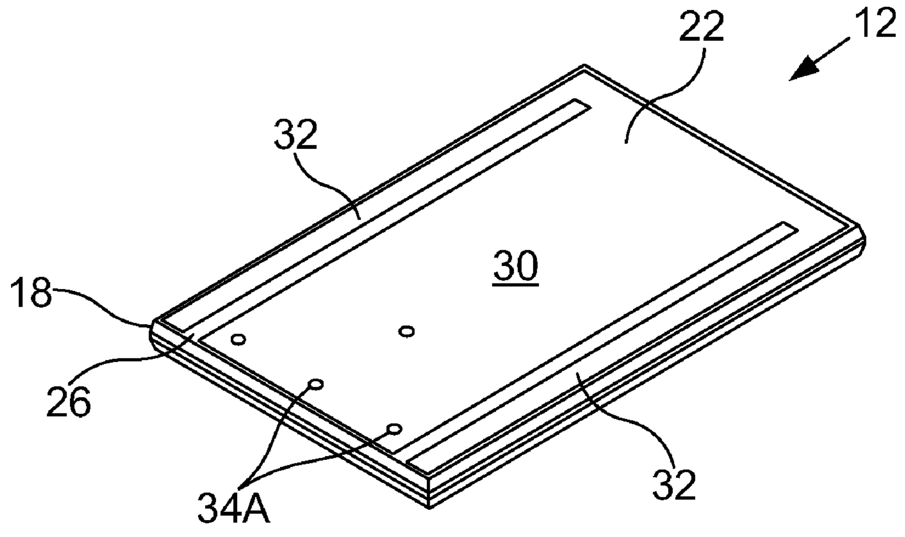
FIG. 5 is another perspective view of the circuit board assembly in FIGS. 2-4.
Figure 6:
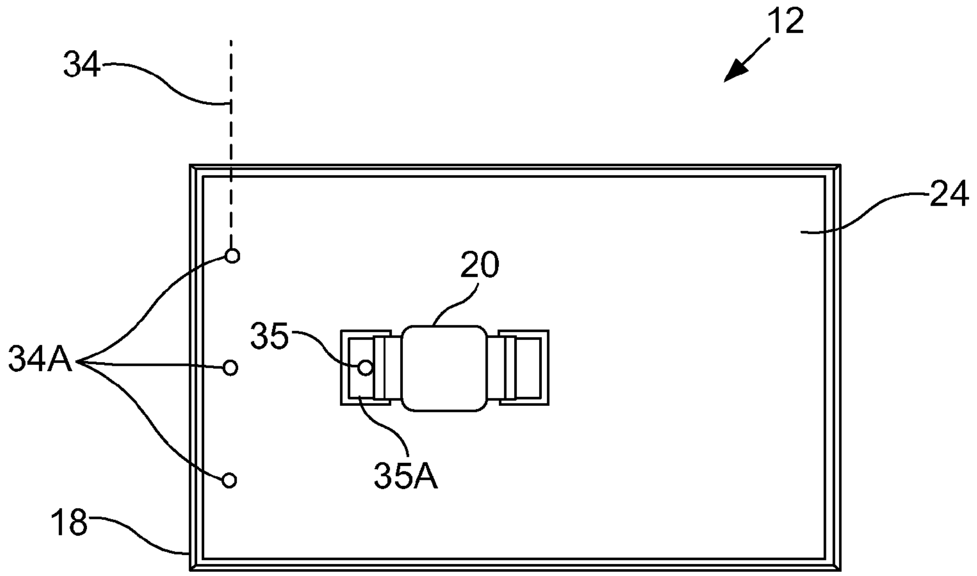
FIG. 6 is a bottom view of the circuit board assembly in FIGS. 2-5.
Figure 7:
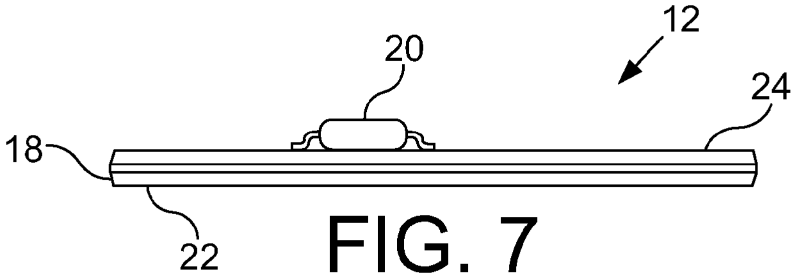
FIG. 7 is a side view of the circuit board assembly in FIGS. 2-6.
Figure 8:
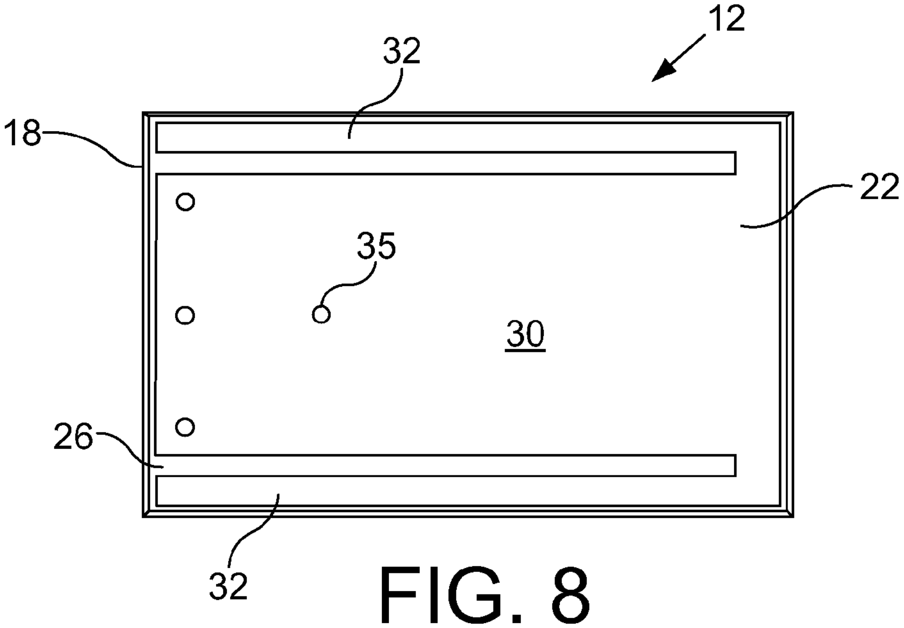
FIG. 8 is a top view of the circuit board assembly in FIGS. 2-7.

Referring now to the drawings, and more particularly to FIGS. 2-11, there is shown an embodiment of an RFID tag (transponder) 10 of the present invention, which generally includes a circuit board assembly 12, backplane 14 and over-molded housing 16.

Circuit board assembly 12 includes a circuit board 18, an RFID circuit 20, an antenna 22, and a metallic ground plane 24. Circuit board or substrate 18 has a first side 26 and a second side 28. Circuit board 18 carries antenna 22 on first side 26. Circuit board 18 carries RFID circuit 20 and ground plane 24 on second side 28.

Circuit board or substrate 18 may be constructed from a material with a high dielectric constant of greater than approximately 4. A substrate material that has a high dielectric constant such as a ceramic filled polytetraflouroethylene (PTFE) or metal oxide ceramic provides good strength, easy processing and a low thermal coefficient of expansion. The high dielectric material permits miniaturization of the antenna, due to the slower velocity of propagation in the medium, hence, reducing the size of the radiating elements.

RFID circuit 20 is preferably constructed as an integrated circuit (IC) which is surface mounted to circuit board 18. RFID circuit 20 could also be mounted to circuit board 18 using leaded or other suitable connections. It is also possible that RFID circuit 20 could be further reduced in size, such as by being configured as an application specific IC (ASIC). It will thus be appreciated that the particular configuration of RFID circuit 20 can vary, depending on the application.

Figure 9:
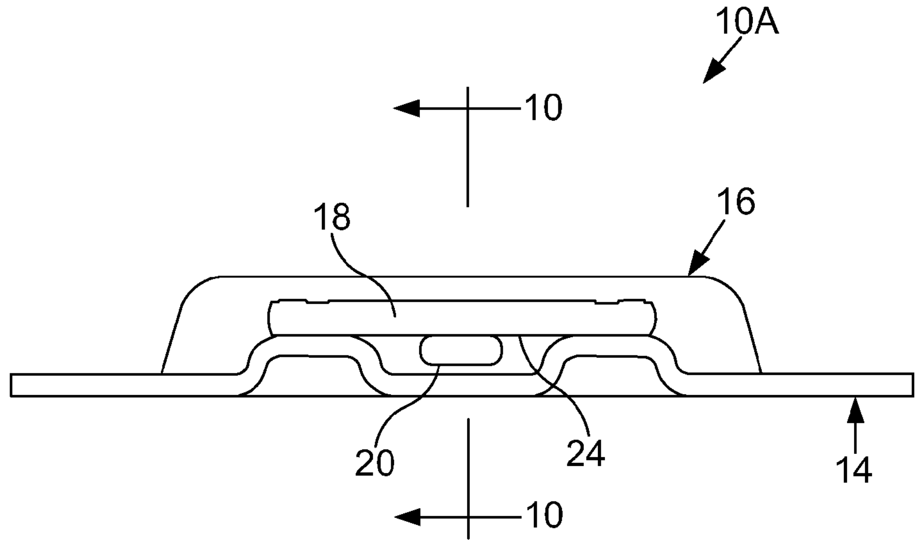
FIG. 9 is an end, sectional view of a slightly different embodiment of an RFID tag of the present invention, with a stamped metal backplane.
Figure 10:
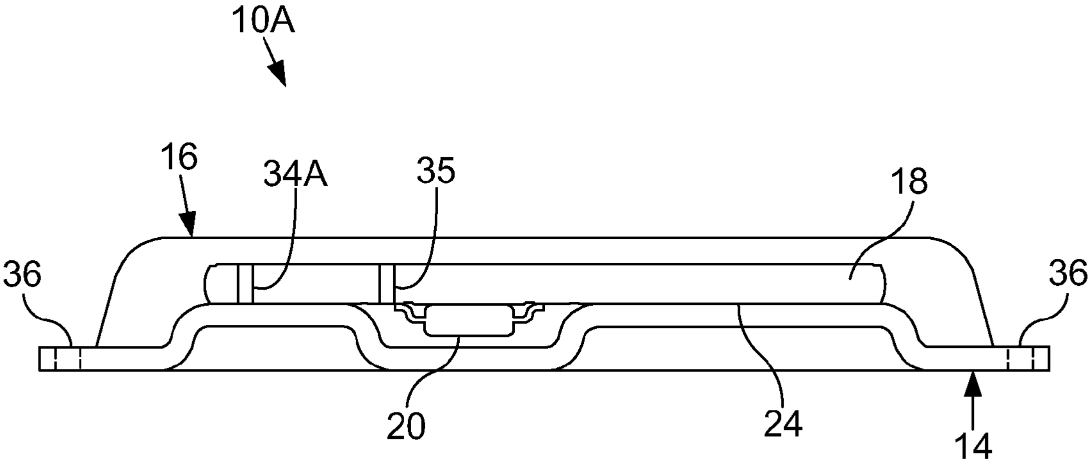
FIG. 10 is a side, sectional view of the RFID tag of FIG. 3, taken along line 10-10 in FIG. 9.
Figure 11:
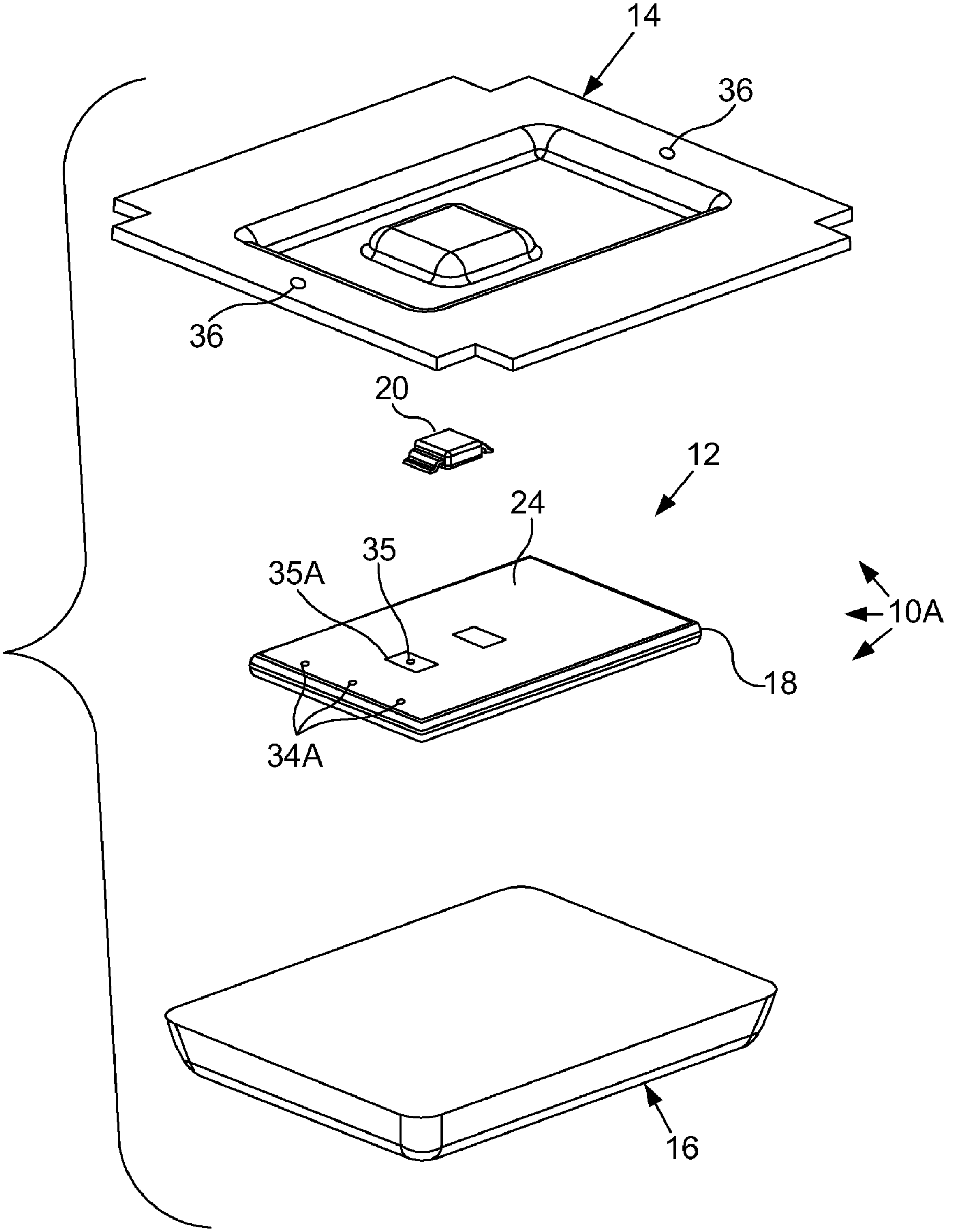
FIG. 11 is an exploded, perspective view of the RFID tag of FIGS. 9 and 10.

RFID circuit 20 may be mounted adjacent to circuit board or substrate 18, or may be positioned within a recess in order to reduce the package size of RFID tag 10. For example, RFID circuit 20 may be positioned within a recess formed in substrate 18 (FIG. 3A) or may be positioned within a recess formed in a stamped metal backplane 14 (FIGS. 9-11).

RFID circuit 20 includes a plurality of components with similar coefficients of thermal expansion so as not to fail from thermal expansion and contraction during repeated autoclave cycles. For example, besides including an IC as described above, RFID circuit 20 may include other integral electronic components with SMT or leaded connections which are formed so as to withstand multiple autoclaving cycles, e.g., greater than 500 cycles, preferably greater than 1000 cycles.

Antenna 22 is mounted flat on circuit board 18 and coupled with IC 20 via a trace or other suitable connection. Antenna 22 is a patch type antenna, preferably with a folded configuration to again reduce size while maintaining adequate surface area. To that end, antenna 22 includes a central portion 30 extending from IC 20 toward one end of circuit board 18, and a pair of folded back arms 32 extending much of the length of circuit board 18 in an opposite direction.

Ground plane 24 is made a part of circuit board assembly 12, and functions to couple circuit board assembly 12 with backplane 14. In theory it might be possible to not use ground plane 24 and instead only use backplane 14, but ground plane 24 offers a less expensive way of coupling circuit board assembly 12 with backplane 14. In the embodiment shown, ground plane 24 is a copper ground plane which is coupled with RFID circuit 20 and provides a reference ground. Ground plane 24 is a shield in the sense that radio frequency (RF) signals radiate in a direction away from ground plane 28, thus shielding the part to which RFID tag 10 is attached from the RF signals. Ground plane 24 has a large enough surface area that it effectively couples with backplane 14. It is possible to use an intervening adhesive between ground plane 24 and backplane 14 which does not affect the coupling therebetween.

Shorting wall 34 includes a plurality of through holes 34A extending through substrate 18 and interconnecting antenna 22 with ground plane 24. The plurality of through holes 34A are generally linearly arranged relative to each other along an edge of ground plane 24. The use of shorting wall 34 transforms RFID tag 10 from a half wavelength to a quarter wavelength, and thereby allows a one-half reduction in the length of antenna 22.

An electrically conductive via 35 extends through substrate 18 and interconnects antenna 22 with RFID circuit 20. Via 35 is located at a distance from shorting wall 34 whereby an impedance of RFID circuit 20 approximately matches an impedance of antenna 22. Positioning via 35 at the correct "impedance matching" distance from shorting wall 34 means that it is not necessary to use an impedance matching stub at the beginning of the connection point with antenna 22, thereby further reducing the length of antenna 22. Via 35 terminates at the side of substrate 18 adjacent ground plane 24 with an insulated electrical terminal 35A. Terminal 35A is coupled with a lead from RFID circuit 20.

Backplane 14 extends past ground plane 24 of circuit board assembly 12. In this manner, backplane 14 forms a larger effective ground plane and also self resonates when RFID tag 10 is attached to a non-metal object. The extent to which backplane 14 extends past ground plane 24 is sufficient to accomplish this self resonating function. Backplane 14 includes at least one mounting feature 36 in an area outside of ground plane 24. In the embodiments shown, backplane 14 includes a pair of mounting features in the form of mounting holes 36 in the area outside of ground plane 24. Backplane 14 is preferably made from stainless steel, but could be made from a different type of suitable metal. Backplane 14 may be a flat piece of metal (e.g., FIGS. 3A and 3B) or may be a stamped metal part (FIGS. 9-11).

Housing 16 is an overmolded housing which surrounds and hermetically seals circuit board assembly 12. In the case of the embodiment shown in FIGS. 3A and 3B, housing 16 completely surrounds RFID tag 10, whereas in the case of the embodiment shown in FIGS. 9-11, housing 16 seals against a stamped metal backplane 14. Housing 16 is constructed from a material which is both autoclavable and has a low dielectric constant of between approximately 1 to 5. Housing 16 is constructed from an autoclavable material which can withstand multiple autoclave cycles at a temperature of greater than approximately 250° F., and can withstand greater than 500 autoclave cycles, preferably greater than 1000 cycles. For example, housing 16 may be constructed from a medical grade, sterilizable material, such as a medical grade plastic, silicone or epoxy. Housing 16 can also be constructed from a biocompatible material if intended to be implanted within an animal. As specific examples, housing 16 may be constructed from polyphenylsulfone, polysulfone, polythemide, or insert silicone rubber which provide an adequate barrier (hermetic seal) to moisture and contaminants, as well as providing a low dielectric (dielectric constant less than 5) buffer to the lower dielectric constant of air (approx 1.1) or higher dielectric constant of body tissue (25-60). For further details of autoclave operating parameters to which RFID tag 10 may be subjected, reference is made to the sterilization standards from the Association for the Advancement of Medical Instrumentation (AAMI), Arlington, Va., USA.

In summary, the present invention is directed to an RFID transponder 10 which is able to be reused, presents a hermetic barrier to contamination from biological agents, and is capable of surviving repeated autoclave and sanitizing cycles.

RFID tag 10 is capable of self resonance when attached to a non-metallic implant or surgical device. RFID tag 10 has its own ground plane (see, e.g., FIGS. 3A and 3B) which facilitates balanced current flow through the elements of the tag and through the ground plane allowing self-resonance independent of mounting to a metallic surface. This capability allows the RFID tag 10 of the present invention to operate in a wide variety of metallic and non-metallic environments.

RFID tag 10 has the unique ability to function in the presence of or mounted to an implanted (in the human body) metal device, or a non-implanted metal surgical tool, or metal storage case or a non-metallic implant, surgical tool or storage case for the purpose of remote (2-12 feet) electronic digital identification. RFID tag 10 is made from a small (less than ¾ inch long, ½ in. wide, and ⅛ in. inch thick) medical grade plastic, silicone, or epoxy encapsulated printed circuit board that is capable of mounting onto an implanted metal orthopedic appliance, or metal shafted surgical tool. The electrically insulating substrate material (interior of printed circuit board or PCB) is formed from a high dielectric and low loss tangent material that facilitates the drastic miniaturization (¼ the size) and high efficiency operation of the device. Additionally, RFID tag 10 utilizes a side loaded shorted folded antenna structure (PCB) that allows the antenna to resonate at less than ¼ the wavelength in the medium (high dielectric) of the frequency used for communicating with RFID tag 10, thus drastically minimizing the size of the device. The overall length of RFID tag 10 is approximately $1/16^{th}$ the normal free space resonant length. The unique design/construction of RFID tag 10 allows recess of RFID circuit 20 from the rear backplane side of the substrate.

According to one aspect of the present invention, the small passive wireless RFID tag 10 is affixed to or mounted on an implantable orthopedic device, storage case or surgical tool that has a small recess, clearance or opening in the device to aid attachment to an area that does not interfere with the normal use of the device. RFID tag 10 can be attached to any conductive metallic device regardless of composition (i.e. aluminum, titanium, lead, tin, steel, iron, brass, bronze, nickel, etc.) due to the relatively low $I^2R$ loss of the material and the larger effective ground plane produced by attachment between RFID tag 10 and the metallic device to which it is attached.

An advantage of the present invention over other self contained antenna RFID tags is the extremely small size and the ability to read and write relatively large distances between the reader and the tag when in the proximity of metal. Most label-based RFID tags are "tuned" to work on plastic, cardboard, glass and other non-metallic materials and are typically relatively large (surface areas of more than 4 square inches). The side loaded shorted-patch design of the present invention incorporates a ground or backplane that completes the current path for the incoming electromagnetic wave. This ground plane when in proximity of or mounted against a still larger metal surface simply increases the effective size of the ground plane which produces a functionally insignificant alteration of the antenna pattern and resonant frequency (which can sometimes also increase the read distance). The design of the present invention suffers minimal detuning from the increase of the effective size of the ground plane, and thus is capable of being utilized in proximity of a large range of different sized implants, storage cases or surgical tools.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A radio frequency identification (RFID) tag, comprising:

a substrate comprised of a material with a high dielectric constant of greater than approximately 4 and having a first side and a second side, a patch antenna mounted to said first side of said substrate;

a metallic ground plane mounted to said second side of said substrate;

an RFID circuit at said second side of said substrate;

a shorting wall including a plurality of through holes extending through said substrate and interconnecting said antenna with said ground plane, said plurality of through holes being generally linearly arranged relative to each other along an edge of said ground plane; and an electrically conductive via extending through said substrate and interconnecting said antenna with RFID circuit, said via being at a distance from said shorting wall whereby an impedance of said RFID circuit approximately matches an impedance of said antenna.

2. The RFID tag of claim 1, including an overmolded housing at least partially surrounding and hermetically sealing said RFID tag, said housing being comprised of a material which has a low dielectric constant of less than 5.

3. The RFID tag of claim 2, wherein said housing is autoclavable.

4. The RFID tag of claim 3, wherein said housing is formed from one of a plastic, silicone and epoxy material.

5. The RFID tag of claim 2, wherein said housing is formed from one of polyphenylsulfone, polysulfone, polythemide, and insert silicone rubber.

6. The RFID tag of claim 1, wherein said substrate is comprised of one of a ceramic filled polytetraflouroethylene (PTFE) and a metal oxide ceramic.

7. The RFID tag of claim 1, including an insulated electrical terminal mounted to said second side of said substrate, said RFID circuit being coupled with said electrical terminal.

8. The RFID tag of claim 1, including a backplane coupled with said ground plane, on a side of said ground plane opposite said substrate.

9. The RFID tag of claim 8, wherein said backplane extends past said circuit board assembly so as to be self resonating.

10. The RFID tag of claim 9, wherein said backplane includes a pair of mounting holes in an area outside said ground plane.

11. The RFID tag of claim 9, wherein said housing seals against said backplane.

12. The RFID tag of claim 9, wherein at least one of said backplane and said substrate includes a recess, said RFID circuit being positioned within said recess.

13. The RFID tag of claim 12, wherein said backplane is a stamped metal backplane including said recess.

14. A radio frequency identification (RFID) tag, comprising:

a circuit board assembly, including:

a substrate comprised of a material with a high dielectric constant of greater than approximately 4 and having a first side and a second side, a patch antenna mounted to said first side of said substrate;

a metallic ground plane mounted to said second side of said substrate;

an RFID circuit at said second side of said substrate;

a shorting wall including a plurality of through holes extending through said substrate and interconnecting said antenna with said ground plane, said plurality of through holes being generally linearly arranged relative to each other along an edge of said ground plane; and an electrically conductive via extending through said substrate and interconnecting said antenna with RFID circuit, said via being at a distance from said shorting wall whereby an impedance of said RFID circuit approximately matches an impedance of said antenna; and a backplane coupled with said ground plane, on a side of said ground plane opposite said substrate.

15. The RFID tag of claim 14, wherein said circuit board assembly includes a plurality of components with similar coefficients of thermal expansion so as not to fail from thermal expansion and contraction during repeated autoclave cycles.

16. The RFID tag of claim 14, wherein said housing is comprised of an autoclavable material which can withstand multiple autoclave cycles at a temperature of greater than approximately 250° F.

17. The RFID tag of claim 16, wherein said autoclavable material can withstand greater than 500 autoclave cycles.

* * * * *